United States Patent [19]

Spillar et al.

[11] Patent Number: 4,697,234
[45] Date of Patent: Sep. 29, 1987

[54] DATA PROCESSING MODULE WITH SERIAL TEST DATA PATHS

[75] Inventors: Alan Spillar, Bolton; Peter L. L. Desyllas, Wilmslow, both of England

[73] Assignee: International Computers, Ltd., London, England

[21] Appl. No.: 880,302

[22] Filed: Jun. 30, 1986

Related U.S. Application Data

[63] Continuation of Ser. No. 498,535, May 26, 1983, abandoned.

[30] Foreign Application Priority Data

Jun. 11, 1982 [GB] United Kingdom ............... 8217006

[51] Int. Cl.[4] ........................................... G06F 13/00
[52] U.S. Cl. .................................................... 364/200
[58] Field of Search ... 364/200 MS File, 900 MS File

[56] References Cited

U.S. PATENT DOCUMENTS

| | | | |
|---|---|---|---|
| 3,517,171 | 6/1970 | Avizienis | 364/200 |
| 4,155,118 | 5/1979 | Lamiaux | 364/200 |
| 4,164,786 | 8/1979 | Gollomp | 364/200 |
| 4,312,066 | 1/1982 | Bantz et al. | 364/200 |
| 4,322,792 | 3/1982 | Bann | 364/200 |
| 4,375,665 | 3/1983 | Schmidt | 364/200 |
| 4,481,570 | 11/1984 | Wiker | 364/200 |

Primary Examiner—Eddie P. Chan
Attorney, Agent, or Firm—Lee, Smith & Zickert

[57] ABSTRACT

A data processing system is constructed from processing modules (e.g. LSI chips). Each module contains storage circuits which are connected together, for test and diagnostic purposes, to form a plurality of shift register paths in parallel between common input and output terminals. The common terminals on all the modules are connected to a diagnostic unit by way of common input and output lines. In operation, a first control message from the diagnostic unit is shifted into a master shift register, connected to the common input line, and this causes one of the modules to be selected. A second control message from the diagnostic unit is then shifted into a control shift register in the selected module, and this causes one of the shift register paths in that module to be selected. Test data can then be shifted into the selected path from the diagnostic unit.

5 Claims, 2 Drawing Figures

DATA PROCESSING MODULE WITH SERIAL TEST DATA PATHS

This application is a continuation of U.S. patent application Ser. No. 498,535, filed May 26, 1983, now abandoned.

BACKGROUND OF THE INVENTION

This invention relates to data processing systems. More specifically, the invention is concerned with arrangements for testing such systems.

One previously proposed arrangement for testing a data processing system is described in British Pat. Specification No. 1,536,147. In that specification, the internal data storage circuits of the system are connected together to form a plurality of serial shift register paths. Normally, the paths are disabled, preventing them from being shifted. However, in a diagnostic mode of operation, a selected one of the paths is enabled, allowing its contents to be shifted. This permits test patterns to be shifted serially into the storage circuits of that path, and the contents of these circuits to be shifted out for inspection.

A data processing system is usually constructed from a number of modules such as large-scale integrated circuit (LSI) chips. It may be desirable for each module to contain several shift register paths as described above. However, a problem which arises in this case is that the number of pins or terminals on the module is limited and hence there may not be enough pins available for all the necessary connections to the paths, for selection, control and data input/output. One object of the present invention is to alleviate this problem.

SUMMARY OF THE INVENTION

According to the invention, there is provided a data processing module comprising a plurality of serial shift register paths, connected in parallel between common input and output terminals on the module, and selection means for selecting one of the paths to allow test data and results to be shifted serially through that path, the selection means comprising:
  (a) a control shift register connected to the common input terminal,
  (b) means for enabling the control shift register to receive a control message shifted serially into it from the common input terminal, the control message containing information identifying one of the paths, and
  (c) means responsive to the control message in the control shift register, for selecting the path identified by that message.

It can be seen that the common input terminal is used not only for shifting data into the paths, but also for receiving the control message which selects the required path for shifting. This results in a significant saving in the number of terminals required.

The control message may also contain a function code specifying a mode of operation for the paths or for the selected path.

One data processing system in accordance with the invention will now be described by way of example with reference to the accompanying drawings.

DESCRIPTION OF AN EMBODIMENT OF THE INVENTION

General

Figure 1:
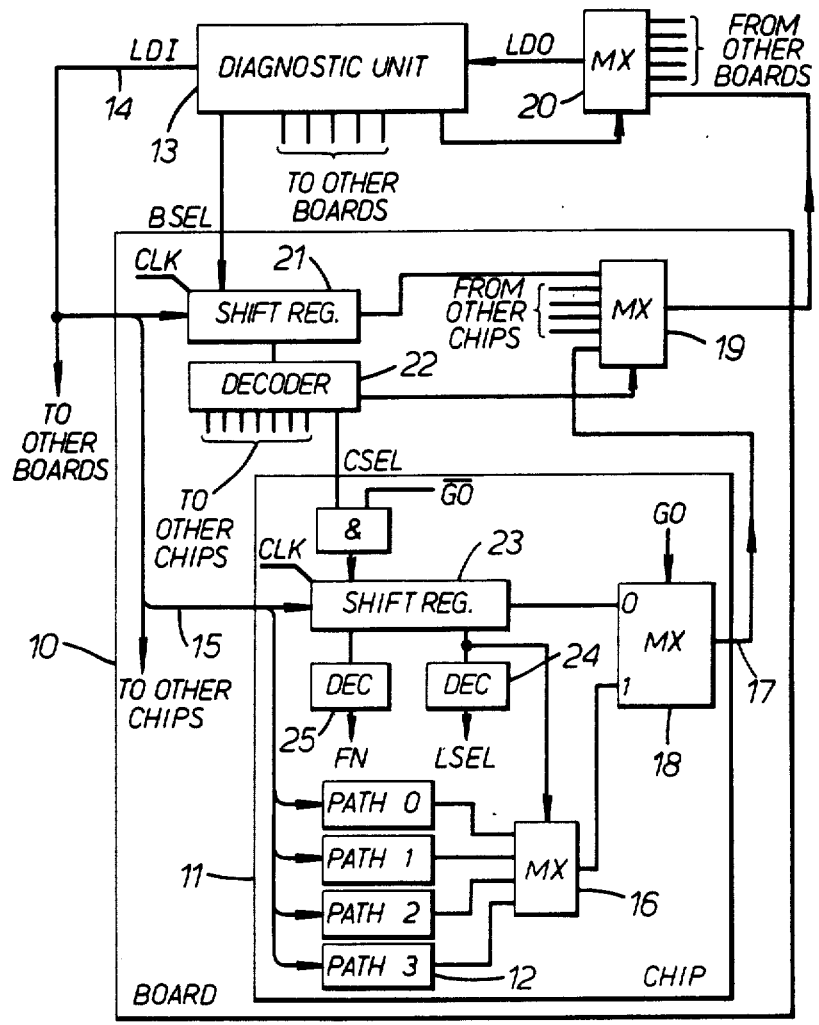
FIG. 1 is a block circuit diagram of the system.

Referring to FIG. 1, the data processing system comprises a plurality of printed circuit boards 10. Each board carries a plurality of large-scale integrated circuit (LSI) chips 11. Each of these chips contains data storage circuits, such as bistables and registers, connected by combinational logic circuits such as logic gates and multiplexers, to form the processing circuits required for the normal processing operation of the system. These processing circuits, and the manner in which they are interconnected, form no part of the invention and so will not be described in detail herein.

As well as being interconnected to form the normal processing circuits, the data storage circuits are also connected together serially, for diagnostic and testing purposes, to form four shift register paths 12 in each chip. Typically, each path may contain up to 72 individual bits. Normally, all the paths in all the chips are inhibited, preventing their contents from being shifted. In this condition, the data storage circuits perform their normal processing functions. However, in a diagnostic mode of operation, one path is selected and enabled for shifting. This permits test patterns to be shifted into the storage circuits of the selected path, and the contents of the selected path to be read out serially.

The system also contains a diagnostic unit 13 which controls the selection of the paths, generates the test patterns, and receives the contents of the paths for inspection. The diagnostic unit 13 produces a serial data input signal LDI on line 14, which is distributed to all the boards 10 and is fed to a serial input terminal 15 on each chip 11. The terminal 15 is connected in parallel to the inputs of all the paths 12 on the chip.

The outputs of the paths are connected to a multiplexer 16 which selects one of the outputs and feeds it to a serial output terminal 17 by way of a multiplexer 18, when a control signal GO=1. (The signal GO is supplied to all the chips.) The output terminal 17 is connected to a multiplexer 19 with similar outputs from the other chips on the board. The output of the multiplexer 19 is connected to another multiplexer 20 with similar outputs from the other boards, to produce a serial data output signal LDO which is returned to the diagnostic unit 13.

Each board contains a shift register 21 referred to as the master shift register. Normally this register is disabled, preventing its contents from shifting. The register 21 is enabled by a board select signal BSEL from the diagnostic unit. When enabled, it has a message shifted into it, one bit at a time, from the line 14, under control of a clock signal CLK. (This clock signal is also received by all the chips 11). Data is also shifted out of the register 21 and returned to the diagnostic unit by way of the multiplexer 19.

The message shifted into the master shift register 21 contains a chip select code, identifying one of the chips 11. This is decoded by a decoder circuit 22 to produce a chip select signal CSEL for the specified chip. One value of the chip select code serves as a broadcast code, and causes all the outputs of the decoder 22 to be enabled, sending chip select signals CSEL to all the chips simultaneously.

Each chip contains a shift register 23 referred to as the control shift register. Normally this register is disabled. The register 23 is enabled by the AND function of the chip select signal CSEL and the inverse of the control signal GO. When enabled, the register 23 has a message shifted into it, one bit at a time, from the terminal 15, under control of the clock CLK. Data is also shifted out of the register and returned to the diagnostic unit by way of the multiplexer 18, when GO=0.

The message shifted into the control shift register 23 includes path select code specifying one of the four paths 12 on the chip. This code controls the multiplexer 16 so as to select the output of the specified path. The code is also decoded by a decoder circuit 24 to produce a path selection signal LSEL for the specified path.

The message also contains a loop function code which specifies a desired mode of operation for the paths. This is decoded by a decoder circuit 25 to produce function control signals FN for the paths. The first three of the function control signals have the following meanings: RUN: All the paths in the chip are put into a normal RUN mode of operation in which all the data storage circuits on the chip perform their normal processing functions. HOLD: All the paths on the chip are put into a hold mode in which their contents are frozen, preventing them from being overwritten. SHIFT: One of the paths, specified by the path select signal LSEL, is placed in a SHIFT mode in which its contents are shifted from left to right as viewed in FIG. 1, one step at each clock pulse. At the same time the other three paths on the chip are put into the HOLD mode.

The function control signals are valid only if GO=1; when GO=0 all the paths on the chip are frozen.

Operation

It is assumed that initially the control shift register 23 in each chip contains the RUN function code and that GO=1, so that all the processing circuits are running normally.

(a) First, the GO signal is removed. This temporarily freezes the operation of the processing circuits.

(b) A board selection signal BSEL is then applied to one or more of the boards, enabling the master shift register 21 in the (or each) board.

(c) A message is now shifted into the master shift register 21 of the selected board, over the line 14. This selects one chip on the board (or, in the case of the broadcast code, selects all the chips on the board).

(d) The signal BSEL is now removed, preventing any further data from being shifted into the master shift register.

(e) A message is now shifted into the control shift register 23 of the (or each) selected chip, over the line 14. This causes the required path to be selected, and generates the function control signals for the paths.

(f) The GO signal is restored. For example, the above procedure may be used in the following manner.

(a) Using the broadcast code, all the paths in the system are set into the HOLD mode.

(b) One selected path is then set into the SHIFT mode, allowing its contents to be shifted out to the diagnostic unit 13 for inspection, and allowing test patterns to be shifted into it from the diagnostic unit.

(c) Finally, the broadcast code is used again to restore all the paths to the RUN mode.

In summary, it can be seen that an individual path is selected by a three stage process. First, a board is selected, then one chip on that board, and then one path within that chip. The chip and the path are selected by messages sent by the diagnostic unit 13 serially over the line 14. Each chip 11 requires only a single input terminal 15 for receiving these messages, and this same terminal is also used for receiving input data for the paths 12.

A possible modification

In the system described above, the decoder 22 has a separate chip selection line CSEL for each chip 11. Thus, for example, a group of ten chips will require ten such lines. This may be a problem if there are not enough output pins available on the decoder 22, which may itself be an LSI chip.

Figure 2:
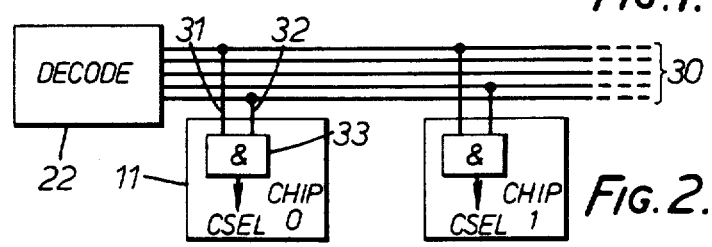
FIG. 2 illustrates a modification of the system.

Referring to FIG. 2, in a modification of the system described above, one out of a group of ten chips is selected by a set of five selection lines 30 leading from the decoder 22. These lines carry a two-out-of-five code which identifies one of the chips as follows:

| Chip No. | Code |
|---|---|
| 0 | 10001 |
| 1 | 10010 |
| 2 | 10100 |
| 3 | 11000 |
| 4 | 01001 |
| 5 | 01010 |
| 6 | 01100 |
| 7 | 00101 |
| 8 | 00110 |
| 9 | 00011 |

As shown, each chip has two selection terminals 31, 32 which are connected to the two lines 30 corresponding to the two ones in the code for that chip. For example, the terminals 31, 32 on chip No. 0 are connected to the first and last of the lines 30. The signals from the terminals 31, 32 are combined in an AND gate 33 on the chip, to produce the chip select signal CSEL for that chip.

It can be seen that whenever one of the above codes is applied to the lines 30, only one of the chips will have both its terminals 31, 32 activated, and only that chip will be selected. The decoder 22 deals with the broadcast code mentioned above by activating all the lines 30, so as to select all the chips.

In the modification described above, the use of the two-out of-five code reduces the number of outputs from the decoder 22 from ten to five. Each chip 11 now requires an extra terminal since it receives two selection input signals instead of one.

A similar coding arrangement may be used for selecting the boards 10, so as to reduce the number of board select lines BSEL from the diagnostic unit 13.

What is claimed is:

1. A data processing module comprising:
   (a) a plurality of serial shift register paths each having a serial input and a serial output,
   (b) a serial input terminal connection in common to the serial inputs of all the shift register paths,
   (c) a control shift register having an enable input and a serial input connected to the serial input terminal,
   (d) means responsive to a select signal for generating an enabling signal to said enable input of said control shift register for enabling the control shift register to serially shift a control message, specifying one of the shift register paths, into the control shift register from the serial input terminal, (e) a serial output terminal, (f) multiplexing means, connected to said serial output terminal and responsive to said control message in the control shift register, for connecting the serial output of a selected one of the shift register paths to the serial output terminal, and (g) control means, responsive to said control message in the control shift register, for selecting one of the shift register paths, and to allow test data received from said serial input terminal to be shifted serially through the selected shift register path to the serial output terminal via said multiplex means.

2. Data processing apparatus comprising:

(a) a plurality of data processing modules, each having a serial input terminal and a serial output terminal, (b) a test data input line connected in common to the serial input terminals of all the modules, (c) a master shift register having a serial input connected to the test data input line, (d) means for enabling the master shift register to serially shift a module-selection message, specifying one of the modules, into the master shift register from the test data input line, (e) a test data output line, (f) module multiplexing means connected to said test data output line and responsive to the module-selection message in the master shift register, for connecting the serial output terminal of a selected one of the modules to the test data output line, and (g) means responsive to the module-selection message in the master shift register for applying a selection signal to the selected one of the modules, each module comprising:

(i) a plurality of serial shift register paths, each having a serial input and a serial output, the serial inputs of all the shift register paths being connected in common to the serial input terminal of the module, (ii) a control shift register having a serial input connected to the serial input terminal of the module, (iii) means responsive to said selection signal for enabling the control shift register to serially shift a path-selection message into the control shift register from the test data input line, the path-selection message specifying one of the shift register paths in the module, (iv) path multiplexing means responsive the the path-selection message in the control shift register, for connecting the serial output of a selected one of the shift register paths in the module to the serial output terminal of the module, and (v) control means responsive to the path-selection message in the control shift register, for enabling the selected one of the shift register paths, to allow test data to be shifted serially through the selected shift register path.

3. Data processing apparatus according to claim 2 wherein each of said modules is an integrated circuit.

4. Data processing apparatus according to claim 2 further including diagnostic means for generating said control messages and test data, connected to said test data input line.

5. Data processing apparatus according to claim 2 wherein said means for applying a selection signal to one of the modules comprises:

(a) a plurality of m selection signal lines, (b) a decoder for generating an n-out-of-m code on the selection signal lines, and (c) a plurality of logic gates, one of each module, each gate having n inputs, the inputs of each gate being connected to a different combination of the selection signal lines, and each gate having an output, the outputs of the gates providing said selection signals for the respective modules.

* * * * *